(12) United States Patent
Tseng et al.

(10) Patent No.: US 7,829,949 B2
(45) Date of Patent: Nov. 9, 2010

(54) HIGH-K DIELECTRIC METAL GATE DEVICE STRUCTURE

(75) Inventors: Joshua Tseng, Linkou Township, Taipei County (TW); Kang-Cheng Lin, Yonghe (TW); Ji-Yi Yang, Taoyuan (TW); Kuo-Tai Huang, HsinChu (TW); Ryan Chia-Jen Chen, Chiayi (TW)

(73) Assignee: Taiwan Semconductor Manufacturing Co., Ltd, Hsinchu (TW)

( * ) Notice: Subject to any disclaimer, the term of this patent is extended or adjusted under 35 U.S.C. 154(b) by 0 days.

(21) Appl. No.: 12/589,421

(22) Filed: Oct. 23, 2009

(65) Prior Publication Data

US 2010/0044800 A1    Feb. 25, 2010

Related U.S. Application Data

(62) Division of application No. 11/926,830, filed on Oct. 29, 2007, now Pat. No. 7,625,791.

(51) Int. Cl.
*H01L 27/092* (2006.01)
(52) U.S. Cl. .................. 257/351; 257/369; 257/407; 257/E27.064
(58) Field of Classification Search .............. 257/351, 257/369, 407, E27.067, E37.064
See application file for complete search history.

(56) References Cited

U.S. PATENT DOCUMENTS

| | | | |
|---|---|---|---|
| 5,763,922 | A | 6/1998 | Chau |
| 6,893,924 | B2 | 5/2005 | Visokay |
| 7,229,893 | B2 | 6/2007 | Wang et al. |
| 2005/0258468 | A1 | 11/2005 | Colombo et al. |
| 2006/0030096 | A1 | 2/2006 | Weimer |
| 2006/0226470 | A1 | 10/2006 | Cho et al. |
| 2007/0178634 | A1 | 8/2007 | Jung et al. |
| 2007/0272975 | A1 | 11/2007 | Schaeffer et al. |
| 2008/0237604 | A1 | 10/2008 | Alshareef et al. |
| 2008/0261368 | A1 | 10/2008 | Ramin et al. |
| 2008/0274598 | A1 | 11/2008 | Ramin et al. |
| 2008/0277726 | A1 | 11/2008 | Doris et al. |

*Primary Examiner*—David Vu
*Assistant Examiner*—Earl N Taylor
(74) *Attorney, Agent, or Firm*—Duane Morris LLP

(57) ABSTRACT

A metal gate/high-k dielectric semiconductor device provides an NMOS gate structure and a PMOS gate structure formed on a semiconductor substrate. The NMOS gate structure includes a high-k gate dielectric treated with a dopant impurity such as La and the high-k gate dielectric material of the PMOS gate structure is deficient of this dopant impurity and further includes a work function tuning layer over the high-k gate dielectric.

20 Claims, 4 Drawing Sheets

HIGH-K DIELECTRIC METAL GATE DEVICE STRUCTURE

RELATED APPLICATION

This application is a divisional application of U.S. patent application Ser. No. 11/926,830, filed on Oct. 29, 2007, now U.S. Pat. No. 7,625,791 the contents of which are hereby incorporated by reference as if set forth in their entirety.

FIELD OF THE INVENTION

The present invention relates, most generally, to semiconductor devices and methods for forming the same. More particularly, the present invention relates to a semiconductor device structure with distinct NMOS and PMOS high-k gate dielectric/metal gate devices disposed on a semiconductor substrate.

BACKGROUND

In the rapidly advancing field of semiconductor device manufacturing, high-k gate dielectric materials, i.e. gate dielectric materials having a dielectric constant, k, of greater than about 3.9, are favored because they produce a smaller equivalent oxide thickness (EOT) and therefore faster transistor devices. There have been many different approaches for incorporating various high-k gate dielectric materials into semiconductor device manufacturing, each with associated shortcomings. The high-k gate dielectric material must be chosen and formed for compatibility with the processing requirements of the other materials used to form the transistor gates. Another complication is that NMOS and PMOS gate structures operate under different conditions and each benefits from being formed of associated materials particularly suited to the device requirement of the respective NMOS or PMOS transistor. Each advantageously operates at a low threshold voltage, Vt. As such, it is increasingly difficult to tailor distinct high-k gate dielectrics for NMOS and PMOS devices formed on the same semiconductor substrate and to integrate each into one manufacturing process that also provides and utilizes other materials needed to form the respective gate structures for PMOS and NMOS transistors. The push to produce NMOS and PMOS transistors that each include a high-k gate dielectric and are formed with different materials to each have suitably low Vt's, is indeed a challenge.

One attempt to produce a semiconductor device having NMOS and PMOS transistors formed of high-k gate dielectric materials is described in U.S. Pat. No. 5,763,922 to Chau which provides an NMOS gate dielectric being nitrogen-rich at the gate dielectric-substrate interface whereas the PMOS gate dielectric is less nitrogen-rich at the gate dielectric-substrate interface. U.S. Pat. No. 6,893,924 to Visokay provides PMOS and NMOS transistors formed using different combinations of low work function metal nitride layers and high work function metal nitride layers. U.S. Pat. No. 7,229,893 to Wang et al. teaches the introduction of various dopant materials into the gate dielectric to form an amorphous portion thereof. One shortcoming associated with U.S. Pat. No. 7,229,893 is that the introduction of the dopant impurities into the high-k gate dielectric, renders the gate dielectric material difficult to remove by etching.

It would be desirable to form both NMOS and PMOS transistors on the same semiconductor substrate using an economy of process operations to produce NMOS and PMOS metal gate/high-k dielectric transistors, each with a suitably low threshold voltage.

SUMMARY OF THE INVENTION

To address these and other needs, and in view of its purposes, the present invention provides structures of high-k metal gate devices including a treated high-k gate dielectric material used to obtain a low Vt for NMOS transistors along with a structure of an untreated high-k gate dielectric material with a work function tuning layer between the high-k gate dielectric material and the metal gate to produce a suitably low Vt for a PMOS transistor.

According to one aspect, provided is a semiconductor device comprising a semiconductor substrate having a PMOS region and an NMOS region, a high-k gate dielectric disposed over the semiconductor substrate in the PMOS and NMOS regions, a PMOS gate structure in the PMOS region, the PMOS gate structure including at least the high-k gate dielectric, a work function tuning layer over the high-k gate dielectric and a first metal layer over the work function tuning layer. An NMOS gate structure is disposed in the NMOS region, the work function tuning layer and the first metal layer absent from the NMOS gate structure and the NMOS gate structure including the high-k gate dielectric with at least one dopant incorporated therein and a second metal layer over the high-k gate dielectric. The high-k dielectric in the PMOS region is deficient of the at least one dopant According to another aspect, provided is a semiconductor device comprising a semiconductor substrate having a PMOS region and an NMOS region. A high-k gate dielectric is disposed over the semiconductor substrate in the PMOS and NMOS regions with the high-k gate dielectric impregnated with a dopant impurity only in the NMOS region. A work function tuning layer is disposed over the high-k gate dielectric and a P-metal layer is disposed over the work function tuning layer in the PMOS region and an N-metal layer is disposed over the high-k gate dielectric in the NMOS region.

According to another aspect, provided is a semiconductor device comprising an NMOS transistor gate and a PMOS transistor gate formed on a semiconductor substrate. The NMOS transistor gate comprises a high-k gate dielectric impregnated with a dopant impurity therein and an N-metal layer. The PMOS transistor gate comprises the high-k gate dielectric, a work function tuning layer formed over the high-k gate dielectric, a P-metal layer formed over the work function tuning layer, and the N-metal layer formed over the P-metal layer. The high-k gate dielectric is substantially free of the dopant impurity in the PMOS transistor gate.

BRIEF DESCRIPTION OF THE DRAWING

The present invention is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

FIG. 4 shows exemplary PMOS and NMOS gate structures formed on a semiconductor substrate according to an embodiment of the invention.

DETAILED DESCRIPTION

The present invention provides a method and structure for forming distinct PMOS and NMOS transistors on the same semiconductor substrate using an economy of masking operations. The PMOS and NMOS transistors have distinct high-k gate dielectrics and the present invention and includes a sequence of processing operations that produces the desirable high-k gate dielectrics while obviating the need to attempt to etch and remove the commonly used but difficult-to-etch $La_2O_3$ high-k gate dielectric. The invention provides a desirable band-edge, BE, effective work function, EWF, for both NMOS and PMOS devices. The respective EWF's can be individually tuned for the NMOS and PMOS structures to provide Vt's that are suitably high or low as desired. IDSAT is improved for both PMOS and NMOS device performances.

Figure 1:
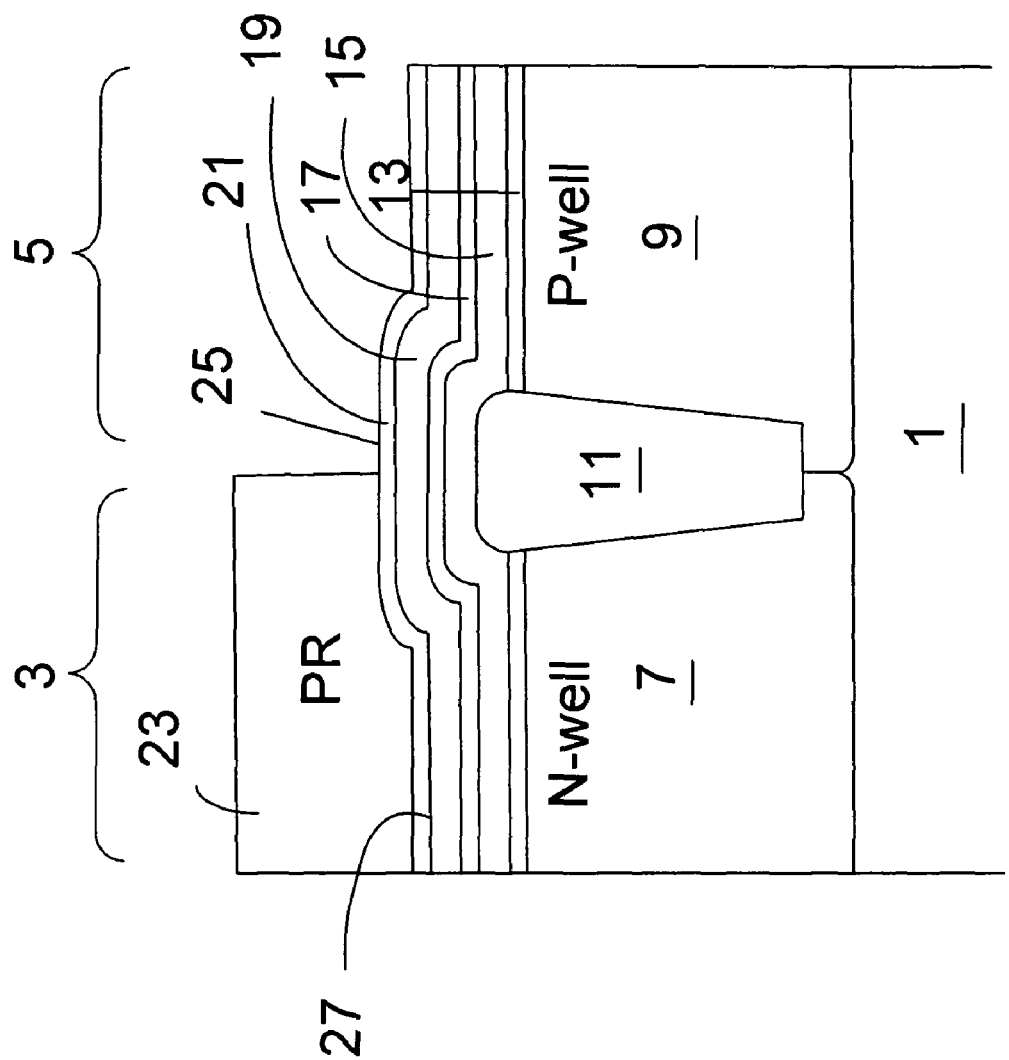
FIGS. 1-4 are cross-sectional views illustrating an exemplary sequence of processing operations according to one aspect of the invention.

Now turning to the figures, FIG. 1 shows semiconductor substrate 1 including PMOS region 3 and NMOS region 5. PMOS region 3 includes N-well 7 formed in semiconductor substrate 1 and NMOS region 5 includes P-well 9 formed in semiconductor substrate 1. Any conventional semiconductor substrate such as Si may be used. In the illustrated embodiment, PMOS region 3 and NMOS region 5 are separated by optional shallow trench isolation, STI structure 11. The gate dielectric consists of optional oxide layer 13 and high-k gate dielectric 15. Optional oxide layer 13 may be of any suitable thickness and may be $SiO_2$ in one exemplary embodiment. High-k gate dielectric 15 may be formed using various suitable processes known in the semiconductor manufacturing industry and high-k gate dielectric 15 may be $HfO_2$ in one advantageous embodiment but may alternatively be HfSiO, HfZrO, HfLaO, SiON, or $SiO_2$ or other suitable high-k gate dielectric materials. Various thicknesses may be used. Work function tuning layer 17 is then formed over high-k gate dielectric material 15. Variations in the thickness of the work function tuning layer 17 assist in determining the work function tuning. Work function tuning layer 17 may include a thickness in the range of 1-50 Angstroms according to one exemplary embodiment but other thicknesses may be used in other exemplary embodiments. In one exemplary embodiment, work function tuning layer 17 may be $Al_2O_3$ and in other exemplary embodiments, work function tuning layer 17 may be $Ga_2O_3$ or $In_2O_3$ or other suitable work function tuning materials known in the semiconductor art. The material used for work function tuning layer 17 is chosen for compatibility with high-k gate dielectric 15 and the subsequently formed metal materials as will be explained.

First metal layer 19 is formed to a suitable thickness over work function tuning layer 17. In one exemplary embodiment, first metal layer 19 may be formed of TaC. In another exemplary embodiment, first metal layer 19 may be TaC/MoO. In other exemplary embodiments, first metal layer 19 may be formed of MoN, TiN, WN, TaCNO, MoO, Pt, Ir, Ru or various metal silicides. In still other exemplary embodiments, various other metals suitable for use as metal gates in P-type devices, i.e. P-metals, may be used. Optional second metal layer 21 is formed over first metal layer 19 in the illustrated embodiment. Second metal layer 21 may be formed of TaC, MoN, TiN, TaN, Yd, HfN, HfC or various metal silicides. In other exemplary embodiments, other metals suitable for use as metal gates in N-type devices, i.e. N-metals, may be used for second metal layer 21. The described structure is then patterned using patterned photoresist film 23, which is formed on upper surface 25 of second metal layer 21 according to conventional methods. According to the embodiment in which optional second metal layer 21 is not present, patterned photoresist layer 23 may be formed directly on top surface 27 of first metal layer 19.

Figure 2:
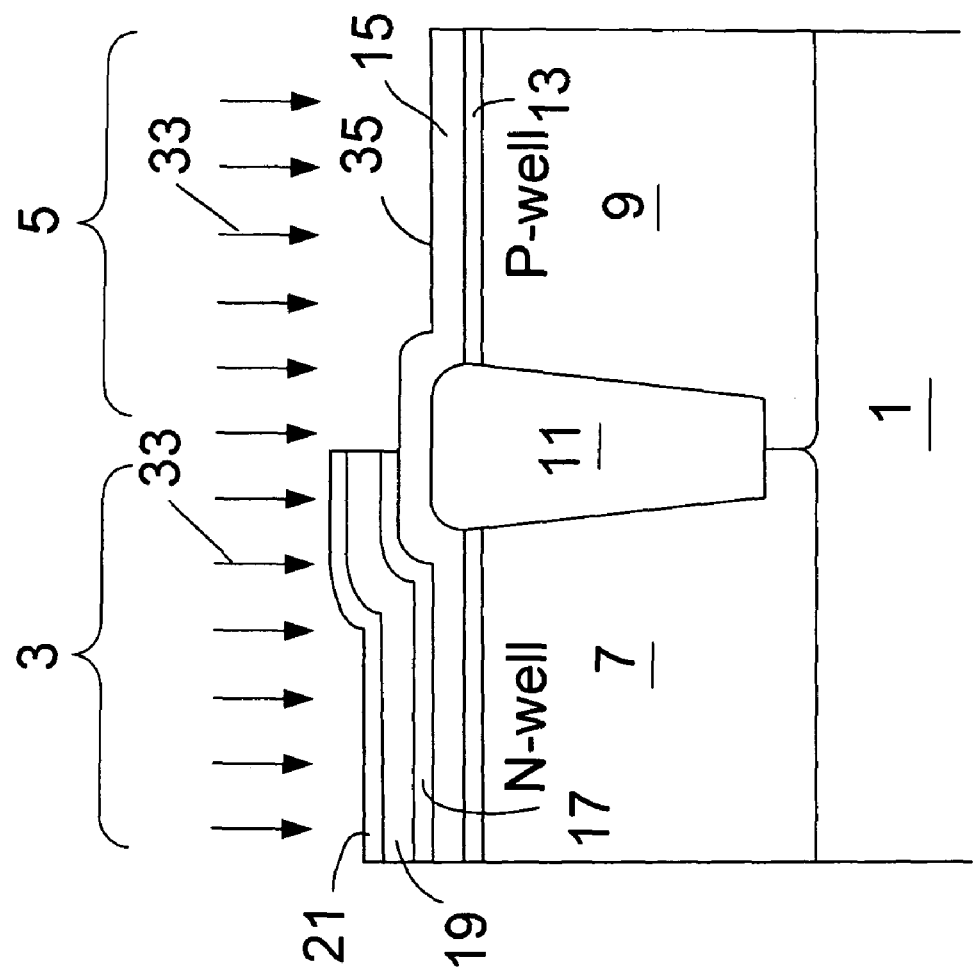

With patterned photoresist layer 23 in place, a series of conventional etching operations is used to successively remove second metal layer 21, first metal layer 19 and work function tuning layer 17 from NMOS region 5, while leaving these same films intact in PMOS region 3. The structure so produced is shown in FIG. 2. A plasma treatment operation indicated by arrows 33 is then carried out on the patterned structure shown in FIG. 2. The plasma treatment is used to selectively treat the exposed portion of high-k gate dielectric 15 in NMOS region 5. The plasma treatment introduces a dopant impurity or impurities into high-k gate dielectric material 15 in NMOS region 5. Work function tuning layer 17, first metal layer 19 and optional second metal layer 21 block the plasma treatment process from introducing the dopant impurities into the portions of high-k gate dielectric 15 in PMOS region 3. In another exemplary embodiment, patterned photoresist layer 23 may also still be intact during the plasma treatment operation. According to one exemplary embodiment, a DPN (decoupled plasma nitridation) process may be used to introduce nitrogen through exposed surface 35 and into high-k gate dielectric 15 in NMOS region 5, thereby impregnating high-k gate dielectric 15 with the dopant impurity of nitrogen. In another exemplary embodiment, a DPLa process may be used to incorporate La into high-k gate dielectric 15 in NMOS region 5 only. According to other exemplary embodiments, other dopant impurities such as dyposium, Dy, or scandium, Sc, may be the dopant impurities incorporated into the high-k gate dielectric material 15 in NMOS region 5 by the selective plasma treatment process. After the plasma treatment operation, the treated high-k gate dielectric material 15 in NMOS region 5 is impregnated with a dopant impurity therein, while portions of high-k gate dielectric 15 in PMOS region 3 are substantially free of the dopant impurity.

Figure 3:
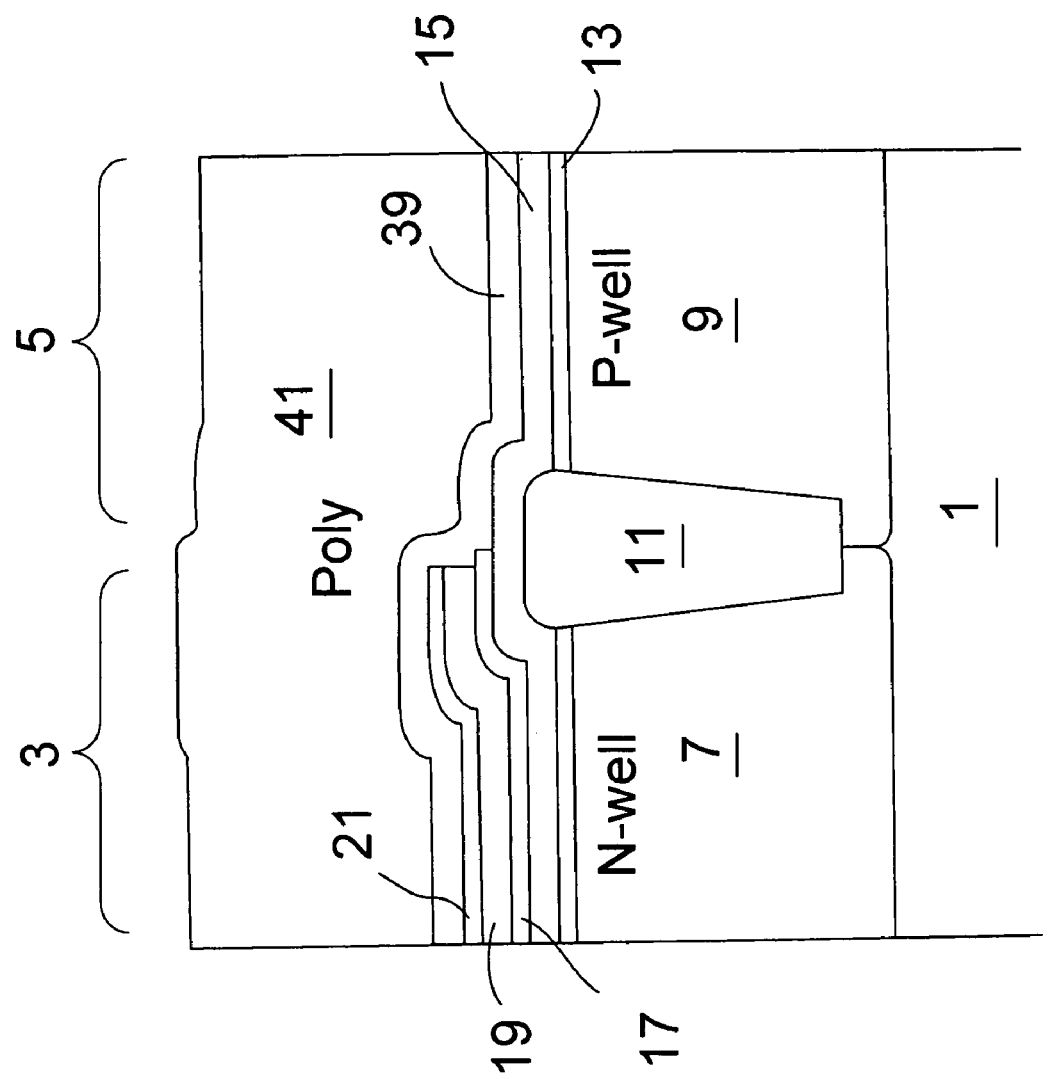

FIG. 3 shows the structure produced after further processing has been carried out upon the structure shown in FIG. 2. In FIG. 3, further metal layer 39 is formed over exposed surface 35 (see FIG. 2) of high-k gate dielectric 15 in NMOS region 5 and over second metal layer 21 in PMOS region 3. In one advantageous exemplary embodiment in which second metal layer 21 is present, further metal layer 39 may be formed of the same material used to form second metal layer 21. According to the exemplary embodiment in which second metal layer 21 is not present, further metal layer 39 may be formed of the materials described in conjunction with second metal layer 21. According to yet another exemplary embodiment, further metal layer 39 may be a metal conventionally used as an N-type metal layer gate material and it may differ from second metal layer 21. Polysilicon layer 41 is formed over further metal layer 39.

Conventional patterning and etching techniques and then conventional spacer formation techniques are used to produce NMOS and PMOS transistor gates from the structure shown in FIG. 3. Exemplary NMOS and PMOS transistor gates are shown in FIG. 4.

Figure 4:
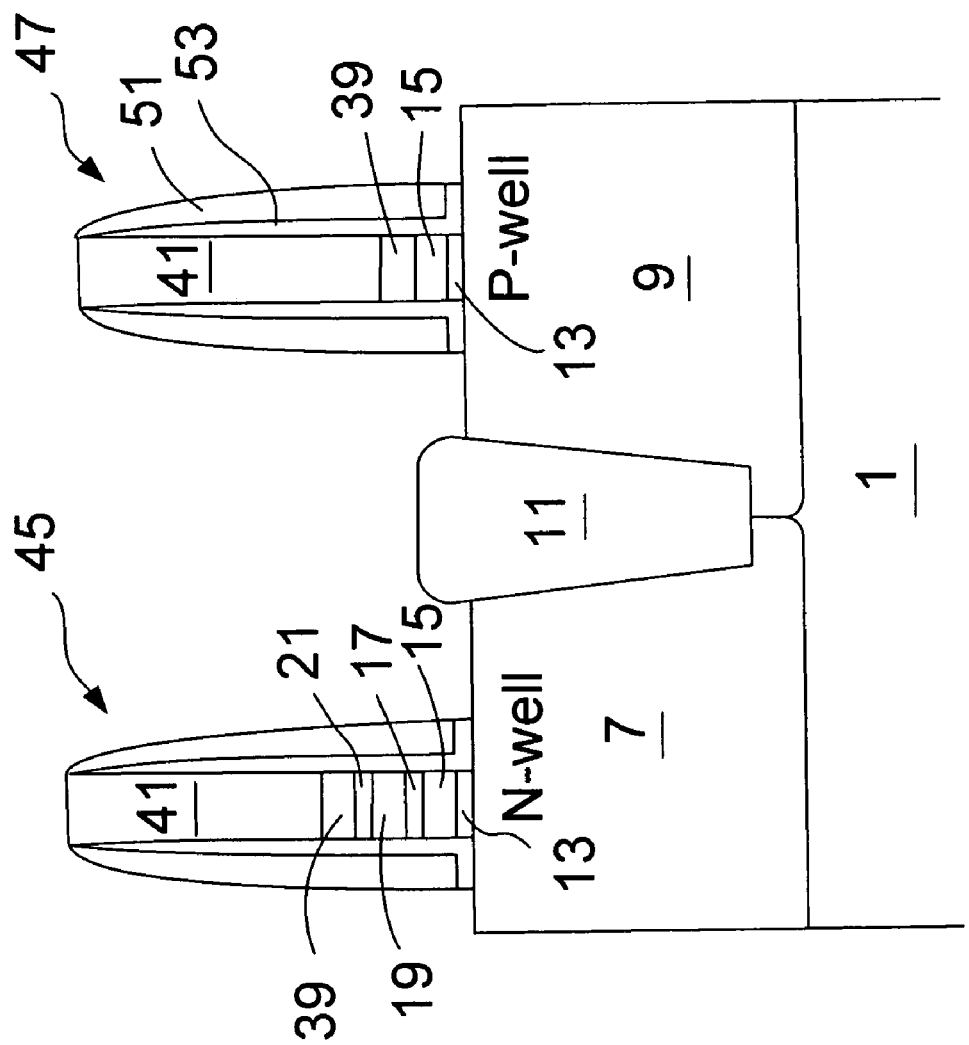

Referring to FIG. 4, PMOS transistor gate structure 45 is formed in PMOS region 3 and NMOS transistor gate structure 47 is formed in NMOS region 5. Each transistor gate structure includes a section of polysilicon film 41 as part of the gate electrode. PMOS transistor gate structure 45 includes sections of further metal layer 39 and second metal layer 21 which may advantageously be the same, first metal layer 19, work function tuning layer 17 and high-k gate dielectric material 15 that is substantially free of dopant impurities. Optional oxide layer 13 is also present. NMOS transistor gate structure 47 includes further metal layer 39 and gate dielectric material 15 impregnated with a dopant material therein, the dopant material being at least one of La, Sc, Dy, and N. Optional oxide layer 19 is also illustrated. Each of PMOS transistor gate structure 45 and NMOS transistor gate structure 47 also includes a dual material spacer that includes an outer nitride portion 51 and an inner oxide portion 53, although such is intended to be exemplary only and other spacer configurations and materials may be used in other exemplary embodiments.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the structure be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A semiconductor device comprising:
a semiconductor substrate having a PMOS region and an NMOS region;
a high-k gate dielectric disposed over said semiconductor substrate in said PMOS and NMOS regions;
a PMOS gate structure in said PMOS region, said PMOS gate structure including at least said high-k gate dielectric, a work function tuning layer over said high-k gate dielectric and a first metal layer over said work function tuning layer; and
an NMOS gate structure in said NMOS region, said work function tuning layer and said first metal layer absent from said NMOS gate structure and said NMOS gate structure including said high-k gate dielectric with at least one dopant incorporated therein and a second metal layer over said high-k gate dielectric,
said high-k dielectric in said PMOS region being deficient of said at least one dopant.

2. The semiconductor device as in claim 1, wherein said first metal comprises a P-metal and said second metal comprises an N-metal.

3. The semiconductor device as in claim 1, wherein said PMOS gate structure further comprises said second metal layer disposed over said first metal layer.

4. The semiconductor device as in claim 3, wherein said first metal comprises a P-metal and said second metal comprises an N-metal.

5. The semiconductor device as in claim 3, wherein said PMOS gate structure and said NMOS gate structure each further comprises a polysilicon film disposed over said second metal layer.

6. The semiconductor device as in claim 1, wherein said work function tuning layer comprises one of $Al_2O_3$, $Ga_2O_3$, and $In_2O_3$.

7. The semiconductor device as in claim 1, wherein said high-k gate dielectric material comprises $HfO_2$ and said dopant comprises one of La, Dy, N and Sc.

8. A semiconductor device comprising:
a semiconductor substrate having a PMOS region and an NMOS region;
a high-k gate dielectric disposed over said semiconductor substrate in said PMOS and NMOS regions with said high-k gate dielectric impregnated with a dopant impurity only in said NMOS region;
a work function tuning layer disposed over said high-k gate dielectric and a P-metal layer disposed over said work function tuning layer in said PMOS region; and
an N-metal layer disposed over said high-k gate dielectric in said NMOS region.

9. The semiconductor device as in claim 8, wherein said N-metal layer is further disposed over said P-metal layer in said PMOS region.

10. The semiconductor device as in claim 8, further comprising an NMOS transistor gate in said NMOS region and a PMOS transistor gate in said PMOS region,
said NMOS transistor gate comprising said high-k gate dielectric impregnated with a dopant impurity therein and said N-metal layer; and
said PMOS transistor gate comprising said high-k gate dielectric, said work function tuning layer, said P-metal layer and said N-metal layer disposed over said P-metal layer.

11. The semiconductor device as in claim 10, wherein each of said NMOS transistor gate and said PMOS transistor gate further comprises a polysilicon layer over said N-type metal layer and spacers along their sides.

12. The semiconductor device as in claim 8, wherein said work function tuning layer comprises $Al_2O_3$ and said high-k dielectric comprises $HfO_2$.

13. The semiconductor device as in claim 8, wherein said dopant impurity comprises one of La, Dy, N and Sc.

14. The semiconductor device as in claim 8, wherein said work function tuning layer comprises one of $Ga_2O_3$ and $In_2O_3$ and said high-k gate dielectric comprises one of HfSiO, HfZrO, HfLaO, SiON and $SiO_2$.

15. A semiconductor device comprising an NMOS transistor gate and a PMOS transistor gate formed on a semiconductor substrate,
said NMOS transistor gate comprising a high-k gate dielectric impregnated with a dopant impurity therein, and an N-metal layer;
said PMOS transistor gate comprising said high-k gate dielectric, a work function tuning layer formed over said high-k gate dielectric, a P-metal layer formed over said work function tuning layer, and said N-metal layer formed over said P-metal layer, said high-k gate dielectric substantially free of said dopant impurity in said PMOS transistor gate.

16. The semiconductor device as in claim 15, wherein said work function tuning layer comprises $Al_2O_3$.

17. The semiconductor device as in claim 15, wherein said high-k dielectric comprises $HfO_2$.

18. The semiconductor device as in claim 16, wherein said dopant impurity comprises one of La, Dy, N and Sc.

19. The semiconductor device as in claim 15, wherein said work function tuning layer comprises one of $Ga_2O_3$ and $In_2O_3$ and said high-k gate dielectric comprises one of HfSiO, HfZrO, HfLaO, SiON and $SiO_2$.

20. The semiconductor device as in claim 15, wherein each of said NMOS transistor gate and said PMbS transistor gate further comprises a polysilicon layer over said N-type metal layer and spacers along their sides.

* * * * *